(12) United States Patent
Glenn

(10) Patent No.: US 6,320,251 B1
(45) Date of Patent: Nov. 20, 2001

(54) STACKABLE PACKAGE FOR AN INTEGRATED CIRCUIT

(75) Inventor: Thomas P. Glenn, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/484,192

(22) Filed: Jan. 18, 2000

(51) Int. Cl.$^7$ .............. H01L 23/02; H01L 23/28
(52) U.S. Cl. .................. 257/678; 257/787; 257/686; 257/685
(58) Field of Search .................. 257/678, 685, 257/787, 690, 692, 693, 694, 695, 696, 788, 796, 784, 99, 100, 679, 686; 438/25, 26, 112

(56) References Cited

U.S. PATENT DOCUMENTS

| 3,838,984 | | 10/1974 | Crane et al. ............... 37/83 |
| 4,398,235 | * | 8/1983 | Lutz et al. ............... 257/686 |
| 4,833,568 | * | 5/1989 | Berhold ................ 361/383 |
| 4,996,587 | | 2/1991 | Hinrichsmeyer et al. ....... 357/74 |
| 5,258,094 | | 11/1993 | Furui et al. .............. 156/634 |
| 5,381,047 | * | 1/1995 | Kanno .................. 257/777 |
| 5,394,010 | * | 2/1995 | Tazawa et al. ............ 257/686 |
| 5,435,057 | | 7/1995 | Bindra et al. ............. 29/830 |
| 5,835,988 | | 11/1998 | Ishii .................... 257/684 |
| 5,859,471 | | 1/1999 | Kuraisha et al. ........... 257/666 |
| 5,877,043 | | 3/1999 | Alcoe et al. ............. 438/123 |
| 5,986,209 | * | 11/1999 | Tandy .................. 174/52.4 |
| 6,114,221 | * | 9/2000 | Tonti et al. .............. 438/455 |

FOREIGN PATENT DOCUMENTS

| 0948048A1 | 6/1999 | (EP) ............... H01L/23/495 |
| 64-54749 | 3/1989 | (JP) . |
| 7-312405 | 11/1995 | (JP) . |
| 8-125066 | 5/1996 | (JP) . |
| 8-306853 | 11/1996 | (JP) . |
| 9-8205 | 1/1997 | (JP) . |
| 9-8206 | 1/1997 | (JP) . |
| 9-8207 | 1/1997 | (JP) . |
| 9-92775 | 4/1997 | (JP) . |
| WO 99/65282 | 12/1999 | (WO) ............... H05K/1/11 |

* cited by examiner

Primary Examiner—Jhihan B Clark
(74) Attorney, Agent, or Firm—Skjerven Morrill MacPherson LLP; James E. Parsons

(57) ABSTRACT

Package embodiments for integrated circuits or other electronic devices are disclosed, along with methods of making and interconnecting the packages. The packages include a package body formed of molded encapsulant. Leads extend from a first end that is embedded at a lower surface of the package body second end that is outside the package body. The leads are bent up the sides of the package and over the top surface of the package. The packages have mounting keys so that a plurality of packages may be precisely stacked one on top of the other. Abutting leads of the stacked packages may be electrically interconnected. The packages also may be placed next to each other so that their leads abut and may be electrically interconnected.

33 Claims, 12 Drawing Sheets

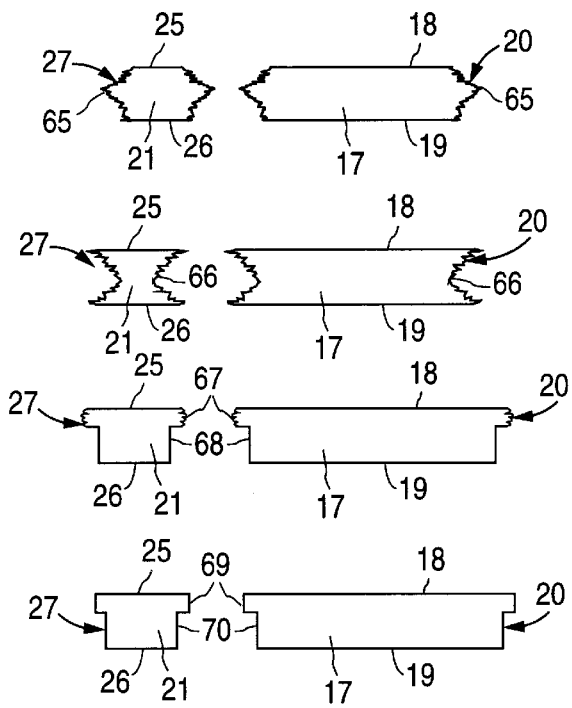
FIG. 10A
FIG. 10B
FIG. 10C
FIG. 10D
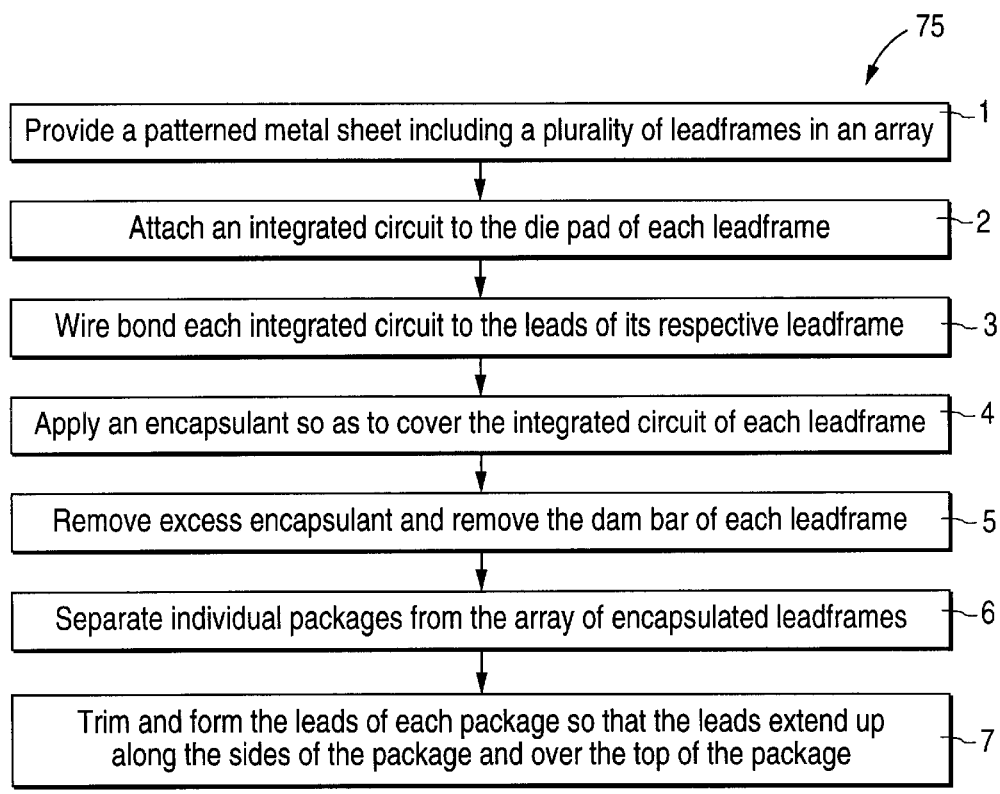
FIG. 11

STACKABLE PACKAGE FOR AN INTEGRATED CIRCUIT

CROSS REFERENCE TO RELATED APPLICATION

This application is related to an application entitled "Methods of Making and Mounting a Stackable Package for Integrated Circuit," application Ser. No. 09/484,192, which was commonly invented and commonly assigned, and which was filed on the same day as the present application.

FIELD OF THE INVENTION

The present application concerns a package for one or more electronic devices (e.g., integrated circuits), and in particular, a package that easily can be electrically interconnected with other similar packages.

BACKGROUND OF THE INVENTION

In the field of integrated circuit packaging, it is known to include a plurality of integrated circuits in a single package body. Bond pads of each integrated circuit are electrically connected by bond wires to leads of the package. The leads are subsequently electrically connected to metal traces on a printed circuit board upon which the package is mounted. Providing a plurality of integrated circuits in one package allows an increase in package density without a significant increase in the area of the printed circuit board that is consumed by the package.

A problem with conventional packages, even packages that contain a plurality of integrated circuits, is that further increases in density per unit area of the printed circuit board are not easily attainable. So, for example, if a package includes two sixteen megabit memory integrated circuits (total thirty-two megabits), then increasing the total amount of memory to 128 megabits would require three additional packages, each of which would require additional mounting area on the printed circuit board.

One known method to increase package density is to mount a first small outline integrated circuit package ("SOIC") having either gull wing or J lead styles on a printed circuit board. The leads are soldered to metal traces on the printed circuit board. Next, the leads of a second SOIC package are cut in length so as to form lead stubs. The second SOIC package is then stacked on top of the first SOIC package, and the lead stubs of the second SOIC package are soldered to the lead stubs of the first SOIC package. This arrangement has obvious shortcomings. First, SOIC packages tend to be thick and much larger rather than the integrated circuit. Thus, a stack of two SOIC packages will have a large footprint and will extend rather high above the printed circuit board. Second, SOIC packages are not meant to be stacked. It is difficult and time consuming to cut the leads of the second SOIC and then solder the cut leads to the leads of the first SOIC. Third, only two SOIC packages can typically be stacked in this manner due to the size of the SOIC packages and the leads. Finally, the footprint of the first SOIC package on the printed circuit board is relatively large due to the gull wing or J-style leads.

SUMMARY OF THE INVENTION

The present invention allows an increase in the density of integrated circuit or other electronic device packages on a printed circuit board without a corresponding increase in the area of the printed circuit board consumed thereby. In addition, the packages of the present invention allow flexibility in determining how many packages to include in a given area of the printed circuit board. For example, packages made in accordance with one embodiment of the present invention may include one or more memory devices. The packages are made so that they can be stacked one on top of the other so as to form a stack of electrically interconnected packages. Accordingly, the size of the memory can be varied by varying the number of packages stacked together. The packages also may be placed side by side on the printed circuit board so that their leads abut. In this manner, adjacent packages and adjacent stacks of packages can be electrically interconnected. Another advantage of the present invention is that the packages may be made very thin (e.g., about 0.5 mm), and near-chip size. Thus, the packages can be densely mounted in small areas of a printed board.

In one embodiment, a package within the present invention includes a package body formed of a molded encapsulant material. The package body includes a first surface, an opposite second surface, and peripheral side surfaces extending vertically between the first surface and the second surface. Within the package body is a planar die pad upon which an integrated circuit device is mounted. Leads extend from a first end that is within the package body and is adjacent to the die pad to a second end outside of the package body. A surface of each lead is exposed at the second surface of the package body. The portion of each lead that extends outside the package body is bent so that the lead extends vertically along the side surface of the package and horizontally over the first surface of the package. The leads thus have a C-shape. The packages may be stacked one on top of the other so that the leads of a lower package will abut the leads of an upper package stacked on the lower package so that the two packages may be electrically interconnected. Alternatively, one package may be placed next to another on a printed circuit board so that the vertically extending portions of the leads of adjacent packages are juxtaposed for electrical interconnection.

BRIEF DESCRIPTION OF DRAWINGS

FIGS. 10A–10D show embodiments of reentrant profiles on side surfaces 20 of die pad 17 and side surfaces 27 of leads 21.

FIGS. 11 is a flow chart of a method 75 of making a stackable package 40.

In the drawings, features of the various embodiments that are similar are usually referred to using the same numbers.

DETAILED DESCRIPTION OF EXEMPLARY EMBODIMENTS

Figure 1:
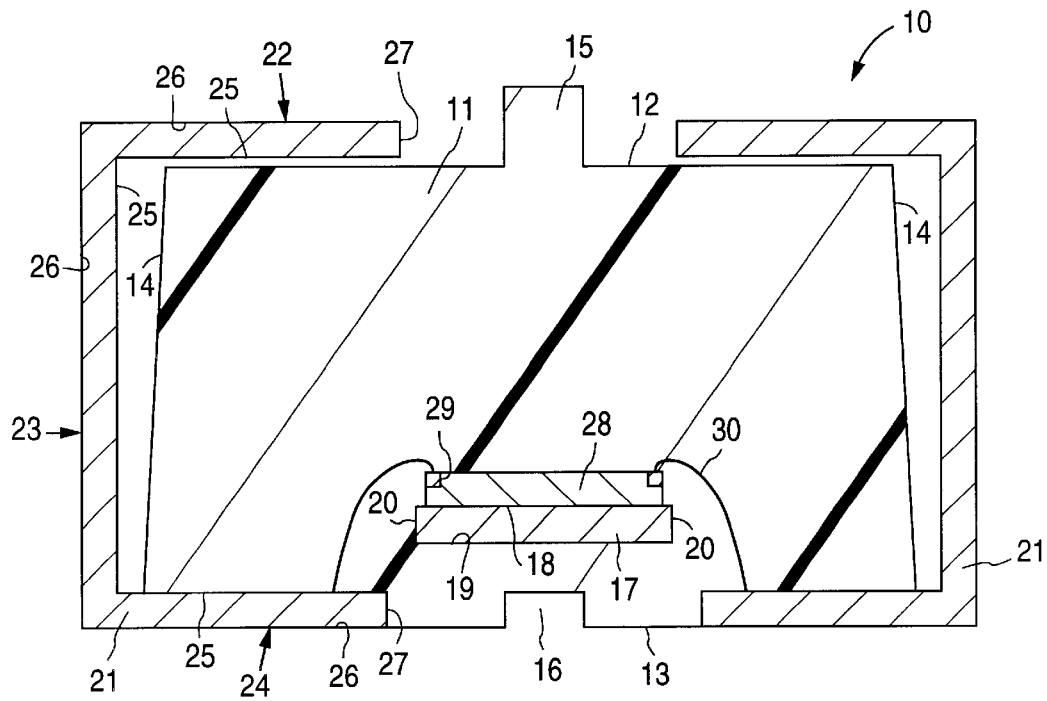
FIG. 1 is cross-sectional side view of a stackable package 10 having an up set die pad 17.

FIG. 1 is a cross-sectional side view of a stackable package 10. Package 10 includes a package body 11 formed of a conventional molded, insulate encapsulant material, such as an epoxy resin. Package 10 includes a largely planar upper first surface 12, an opposite largely planar lower second surface 13, and tapered peripheral side surfaces 14 that extend vertically between first surface 12 and second surface 13. Package 10 may be made so as to be near-chip size, and, depending on the size of the integrated circuit or other electronic device therein, may be quite thin (e.g., about 0.5 to 0.7 mm).

Figure 2:
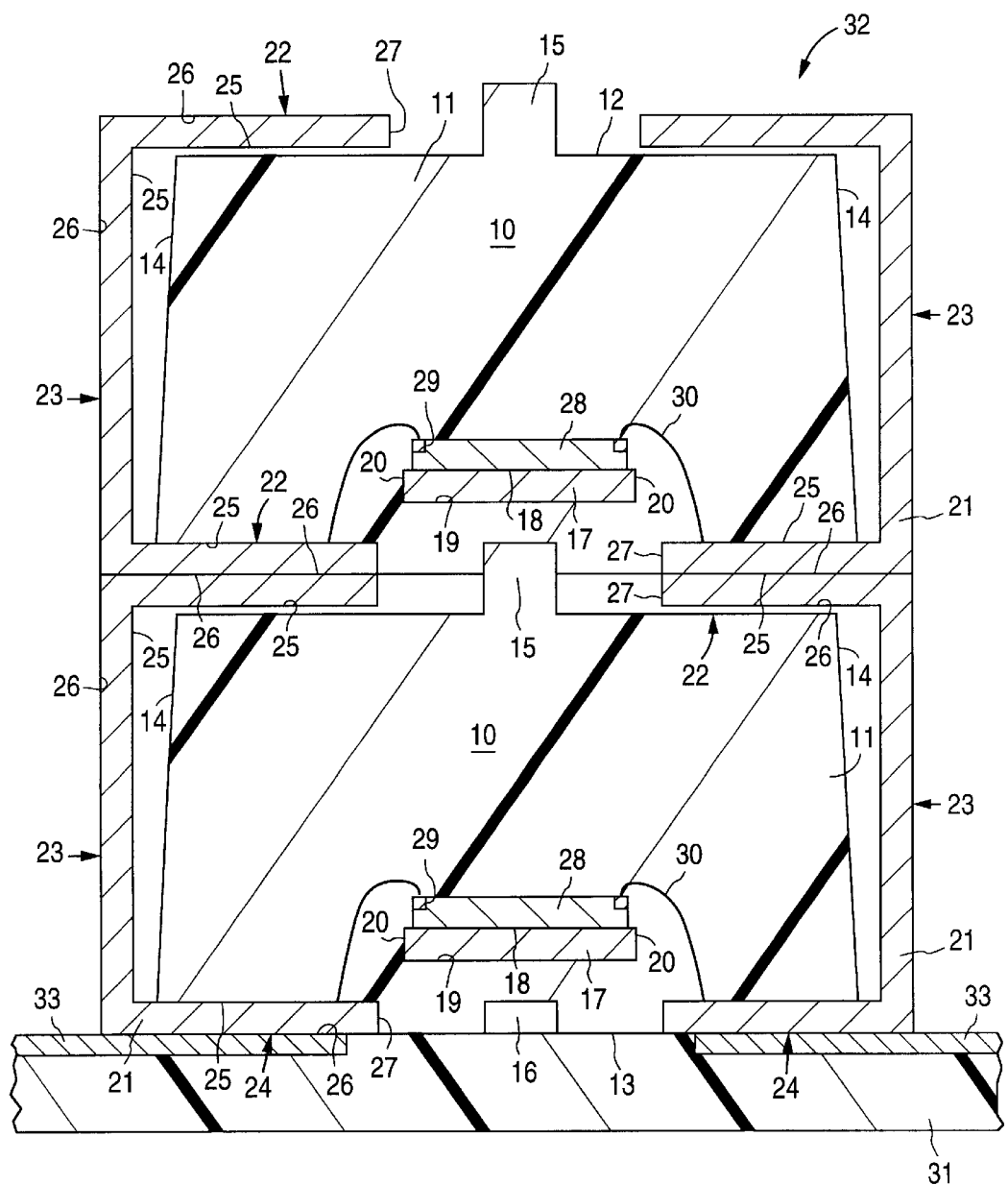
FIG. 2 is a cross-sectional side view of a stack 32 of two packages 10.

Referring to FIG. 1, two protruding keys 15 formed of encapsulant material extend from first surface 12 of package body 11. (Only one key 15 is visible in this cross sectional view.) Second surface 13 of package body 11 includes two keyholes 16. (Only one keyhole 16 is visible in this cross sectional view.) Keys 15 are formed so as to engage with a keyhole 16 of another package that is to be stacked on first surface 12, as is shown in FIG. 2. The engagement of keys 15 into respective keyholes 16 of another package stacked thereon assures that the packages can only be stacked in one way. This avoids possible alignment and electrical interconnection errors during the assembly of a stack of packages. The number, shape and location of keys 15 and keyholes 16 of package 10 can vary according to the available room on first surface 12 and second surface 13 of package body 11.

Package 10 includes a rectangular planar metal die pad 17. Die pad 17 includes a planar first surface 18, an opposite planar second surface 19, and side surfaces 20 extending between first surface 18 and second surface 19. Die pad 17 is up set within package body 11 so that encapsulant material covers second surface 19 of die pad 17. Keyhole 16 is adjacent to second surface 19 of die pad 17.

Package 10 also includes a plurality of metal leads 21. Leads 21 may extend from one side 14 of package 10, as in a single in-line package; from two opposing sides 14 of package 10, as in a dual package; or from all four sides of package 10, as in a quad package. The number of leads 21 will vary with the application. Leads 21 may be plated with 80-20 solder for subsequent electrical connection of package 10 to a printed circuit board or to the leads of another package 10.

Leads 21 include two approximately 90° bends so as to have a C-shape. A horizontal first portion 22 of each lead 21 extends over and is just above or on first surface 12 of package 10. A second portion 23 of each lead 21 extends vertically adjacent to side surface 14 of package 10. Finally, a horizontal third portion 24 of each lead 21 is embedded at second surface 13 of package body 11. Before being bent into a C shape, each lead 21 is planar. Hence, each first portion 22, second portion 23, and third portion 24 of each lead 21 has a planar inner first surface 25, an opposite planar outer second surface 26, and side surfaces 27 extending between first surface 25 and second surface 26.

In one embodiment discussed below, side surfaces 20 of die pad 17 and side surfaces 27 of leads 21 have a reentrant profile. Side surface 20 and 27 are covered with encapsulant, which flows into the reentrant portion(s) of side surfaces 20 and 27 during an encapsulation step. The engagement of the reentrant portion(s) and encapsulant locks die pad 17 and leads 21 to package body 11, and thereby increases package reliability.

In package 10, die pad 17 is entirely within package body 11. Most of third portion 23 of each lead 21 also is within package body 11. In particular, encapsulant covers first surface 25 and side surfaces 27 of third portion 24 of each lead 21. Second surface 26 of third portion 24 of each lead 21 is not covered by encapsulant, but rather is exposed at lower second surface 13 of package body 11. Accordingly, third portion 24 of leads 21 may be electrically interconnected to an underlying printed circuit board or another package.

Package 10 includes an electronic device that is within package body 11. The type of electronic device may vary. In this exemplary embodiment, the electronic device is an semiconductor integrated circuit 28. Integrated circuit 28 is mounted on first surface 18 of die pad 17. An adhesive such as epoxy may be used to attach integrated circuit 28 to first surface 18. Electrically conductive bond pads 29 on integrated circuit 28 are each electrically connected by a metal (e.g., gold, gold alloy, copper, or aluminum) bond wire 30 to a first surface 25 of a third portion 24 of a lead 21. In this manner, integrated circuit 28 may be accessed via leads 21.

FIG. 2 shows a module of two packages 10 mounted one on top of the other on a printed circuit board 31, thus forming a stack 32 of two electrically interconnected packages 10. Leads 21 of the lower package 10 are electrically connected to metal traces 33 on printed circuit board 31. The electrical connection typically will include reflowed solder that is electrically connected between the traces and the juxtaposed third lead portions 24. In particular, solder is electrically connected between traces 33 and the exposed second surfaces 26 of third portions 24 of leads 21 of package 10. The upper package 10 is stacked on the lower package 10 so that keys 15 of the lower package 10 are each in a keyhole 16 of the upper package 10. Leads 21 of the lower package 10 are juxtaposed with mirror-image leads 21 of the upper package 10, thus forming an electrical interconnection. Solder is electrically connected between the second surface 26 of the first portion 22 of each lead 21 of the lower package 10 and the juxtaposed second surface 26 of the third portion 24 of the corresponding lead 21 of the upper package 10. The solder connections may be made by reflowing 80-20 solder or some other solder that is plated on or otherwise pre-applied to the leads. Other conventional soldering methods can be used as well.

Figure 3:
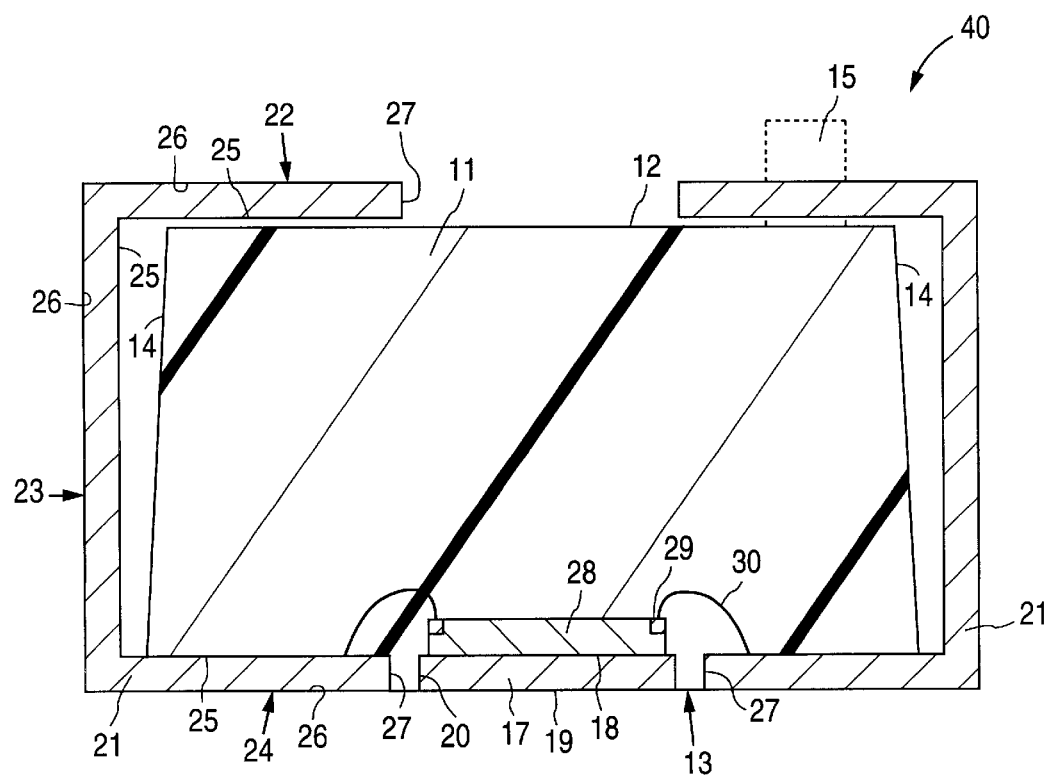
FIG. 3 is cross-sectional side view of a stackable package 40 having an exposed die pad 17.

FIG. 3 is a cross-sectional view of an alternative stackable package 40 in accordance with another embodiment of the present invention. Package 40 is similar to package 10 of FIG. 1. In package 40, however, die pad 17 is not up set into package body 11, as in package 10 of FIG. 1, but rather is embedded at lower second surface 13 of package body 11 in the same horizontal plane as third portion 24 of leads 21. Lower second surface 19 of die pad 18 is exposed at second surface 13 of package body 11. Second surface 26 of third portion 24 of each lead 21 also is exposed at second surface 13. Key 15 and keyhole 16 (not shown) are relocated to another portion of first surface 12 and second surface 13, respectively, of package 40. In FIG. 3, a key 15 is shown by dash lines at the right hand portion of first surface 12. To make room for key 15 (and keyhole 16), one of the leads 21 of package 40 has been removed. In an alternative embodiment, key 15 and keyhole 16 may be located in an unoccupied area that is laterally between die pad 18 and leads 21. The exposed die pad 17 of package 40 may be soldered to a metal portion of a printed circuit board in order to sink out heat from the package.

Figure 4:
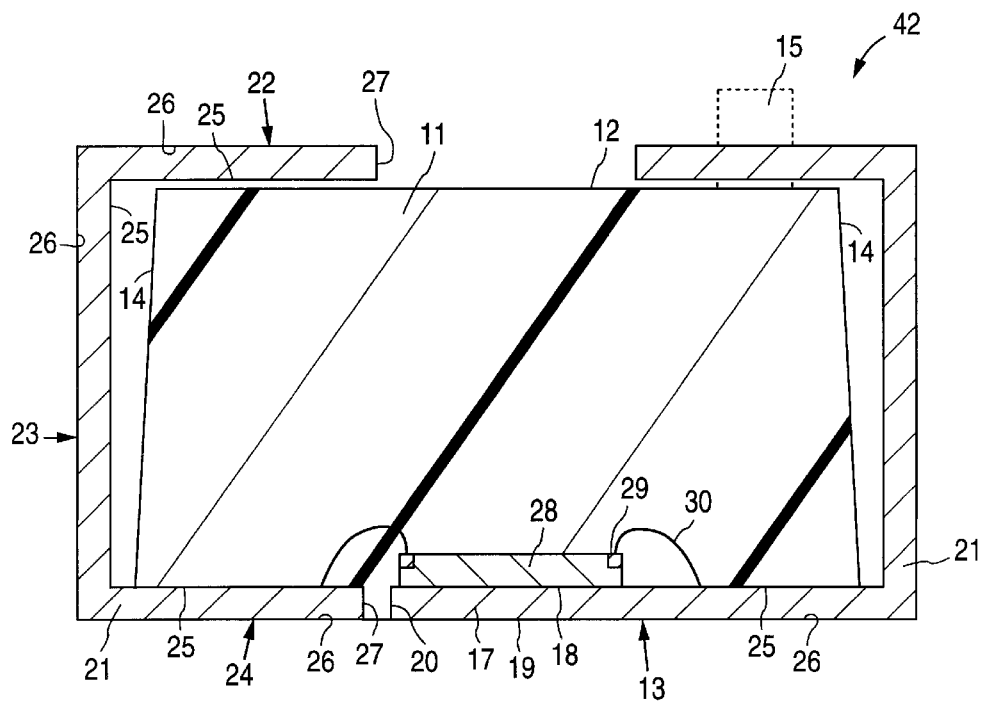
FIG. 4 is cross-sectional side view of a stackable package 42 having a die pad 17 integrally joined to a lead 21.

FIG. 4 shows an alternative stackable package 42 in accordance with the present invention. Package 42 is the same as package 40 of FIG. 3, except that a third portion 24 of one or more leads 21 is integrally connected (and hence electrically connected) to die pad 18. With this configuration, die pad 18 of package 42, and die pads 18 of one or more packages 42 stacked thereon, may be electrically connected to a common electrical potential, such as ground. The integrally connected lead or the exposed second surface 19 of the lowermost package may be soldered to a ground voltage source on the printed circuit board.

Figure 5:
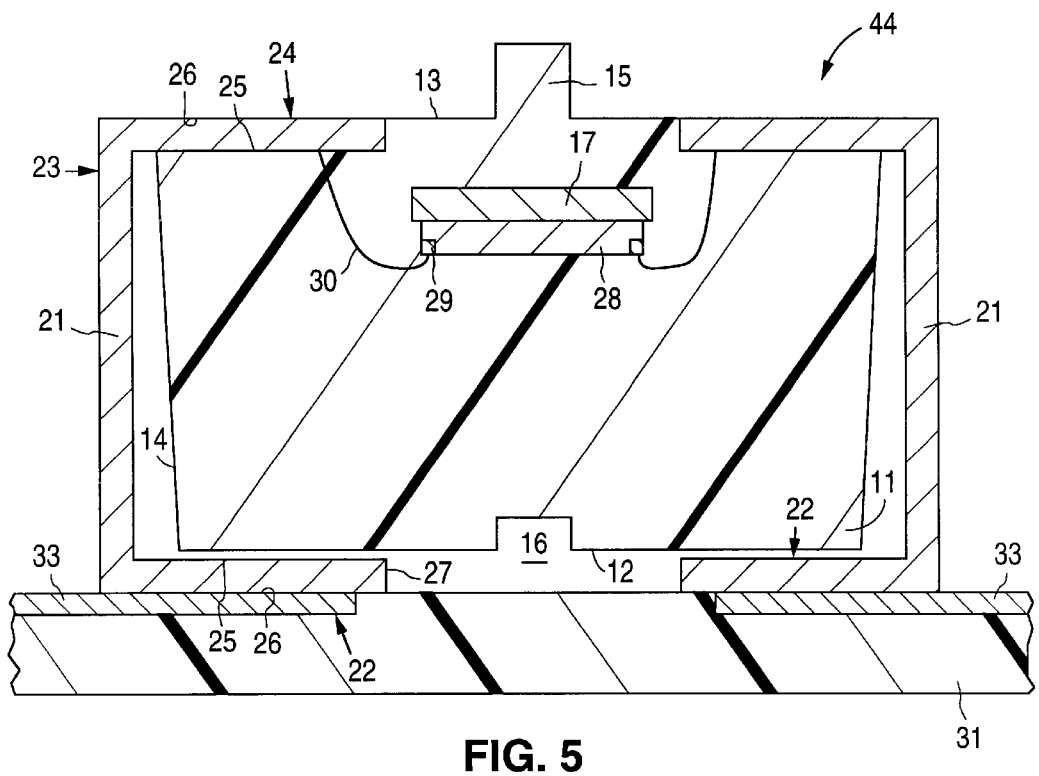
FIG. 5 is cross-sectional side view of a stackable package 44 wherein a key 15 extends from a package surface that is adjacent to die pad 17.

FIG. 5 shows another embodiment of a package 44 within the present invention. Package 44 of FIG. 4 is similar to package 10 of FIG. 1. One difference between package 44 and package 10 is that the locations of keys 15 and keyholes 16 are reversed. In package 44 of FIG. 5, keys 15 extend from second surface 13, and keyholes 16 are formed at first surface 12 of package 44. Because of the location of keys 15, package 44 is mounted on a printed circuit board 31 such that integrated circuit 28 is inverted and second surface 26 of first portion 22 of each lead 21 is electrically connected by solder to metal traces on a printed circuit board.

Figure 6:
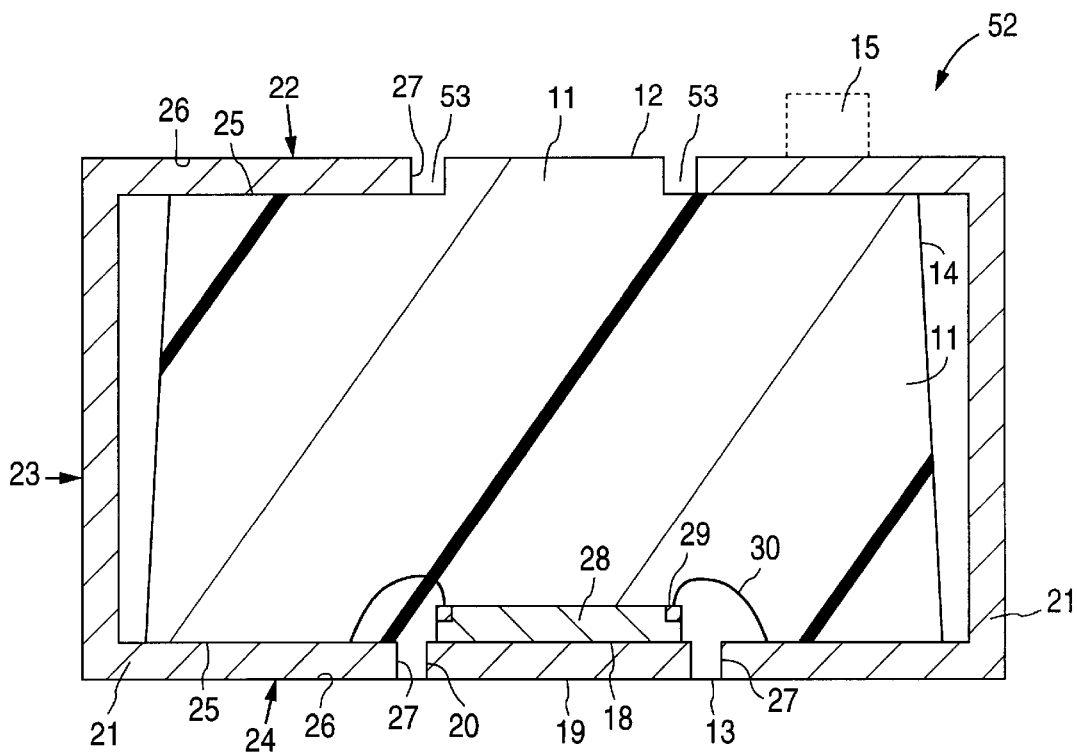
FIG. 6 is cross-sectional side view of a thin stackable package 52.

FIG. 6 shows another embodiment of a package 52 within the present invention. Package 52 is similar to package 40 of FIG. 3. One difference is that, in package 52, slot-like grooves 53 have been molded into package body 11 at first surface 12. Each first portion 22 of a lead 21 is in a groove 53. Providing grooves 53 for receiving leads 21 allows package 52 to be thinner than package 40 of FIG. 3. Alternatively, instead of providing individual grooves 53 for first portion 22 of each lead 21, a transverse groove may be molded into first surface 12 of package body 11 to accommodate all of the adjacent leads 21 on one side 14 of package body 11. A package 52 having such grooves may have a thickness of about 0.5 mm, depending on the size of the integrated circuit 28.

Figure 7:
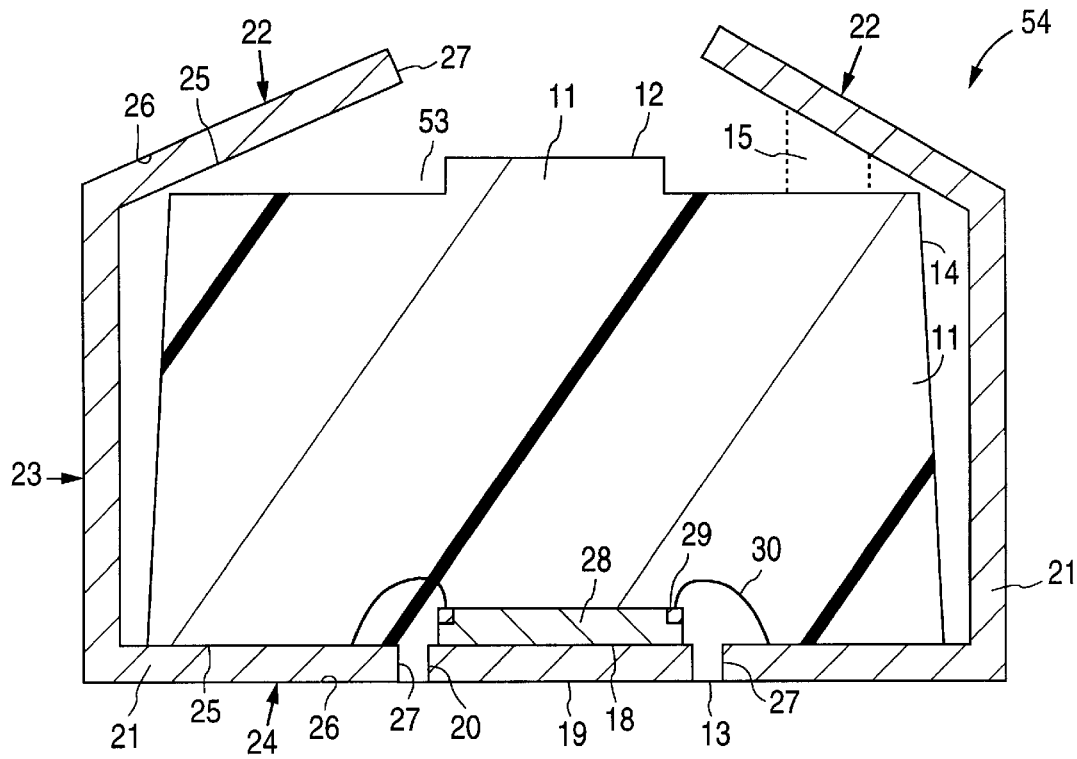
FIG. 7 is cross-sectional side view of a thin stackable package 54 having leads 21 that are bent so as to apply a force to the leads of another package stacked thereon.

FIG. 7 shows another embodiment of a package 54 within the present invention. Package 55 is similar to package 52 of FIG. 6, except that first portion 22 of leads 21 extends over first surface 12 of package body 11 at an oblique angle, rather than an horizontal angle as in package 52 of FIG. 6. The oblique orientation of first portion 22 is provided during the lead trim and form operation that bends leads 21. Providing an oblique orientation to first portion 22 of leads 21 of package 54 gives a spring-like action to leads 21 that forces the leads 21 up against the leads 21 of another package that is stacked on the first package 54. Accordingly, a firm physical and electrical interconnection of the stacked packages 54 can be obtained without using a solder interconnection. Of course, solder also can be used to join the stacked packages.

Figure 8A:
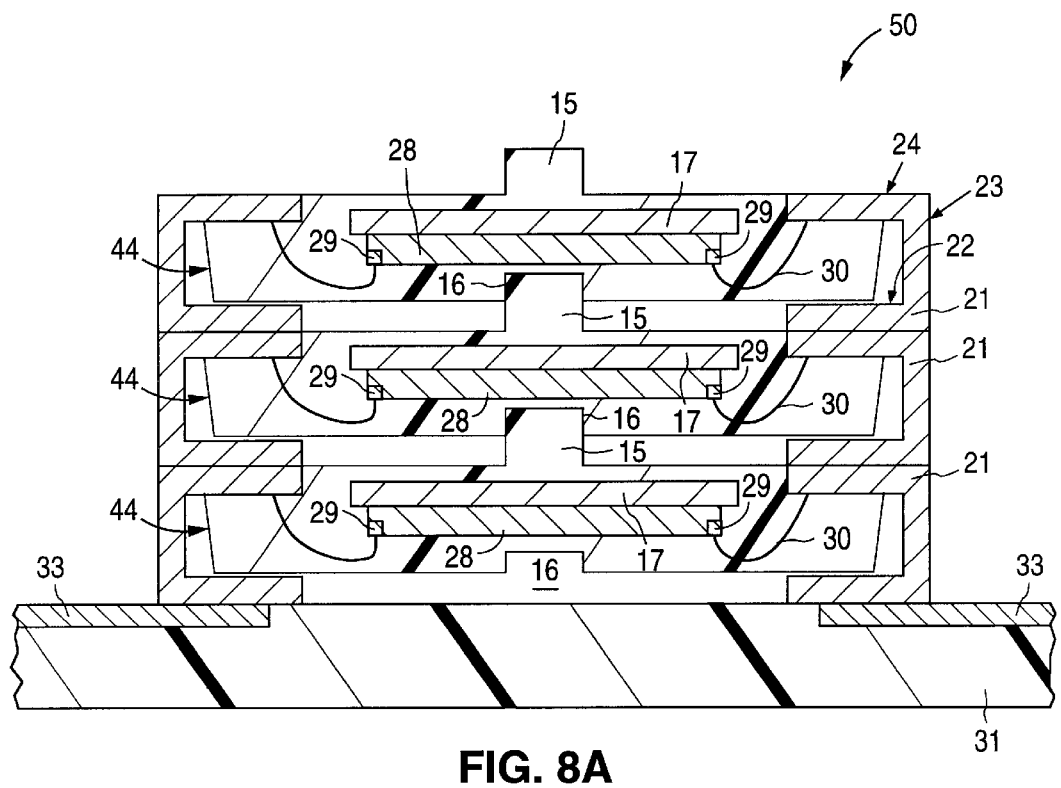
FIGS. 8A–8D show embodiments of interconnected packages 44.
Figure 8B:
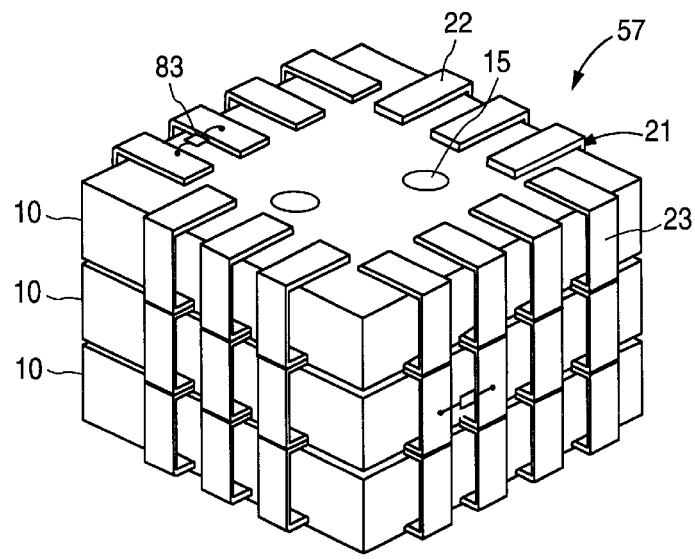
Figure 8C:
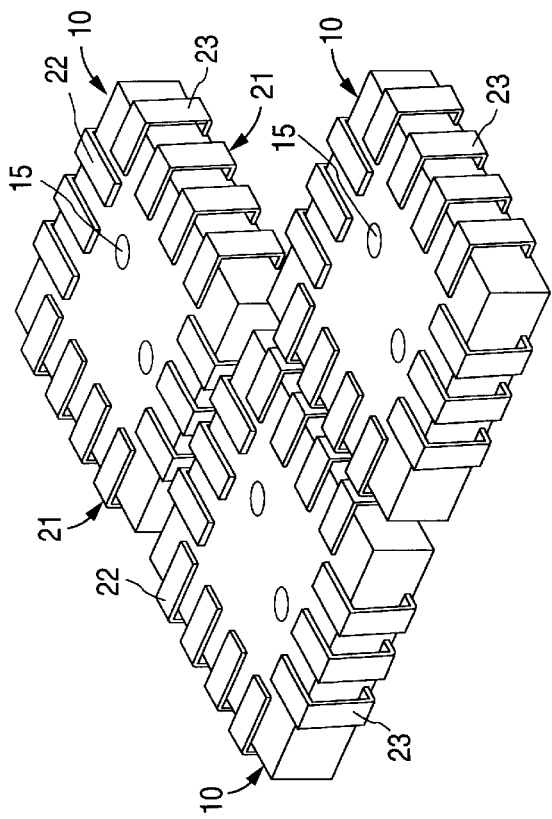
Figure 8D:
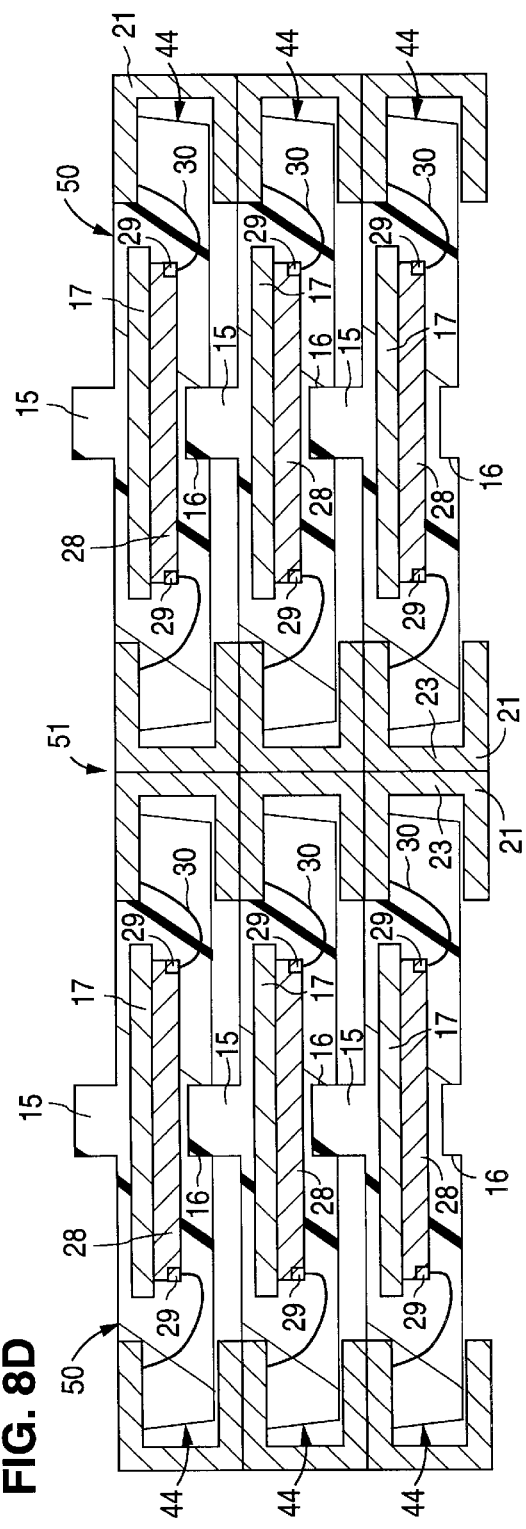

FIGS. 8A–8D show exemplary stacks of a plurality of packages. FIG. 8A shows a cross-sectional side view of a stack 50 of three packages 44 (FIG. 5). FIG. 8B is a perspective view of a stack 57 of three packages 10. In this embodiment, optional passive devices 83 (e.g., a resistor, capacitor or inductor) are electrically connected between first portions 22 and second portions 23 of two adjacent leads 21 of the top and middle packages 10, respectively. FIG. 8C is a perspective view of three abutting and electrically interconnected packages 10 that are in a common horizontal plane. The juxtaposed vertical second portions 23 of the leads 21 of adjacent packages 10 are electrically interconnected so that the integrated circuits 28 therein may be electrically interconnected. FIG. 8D is a cross-sectional side view of a double stack 51 comprised of two abutting and electrically interconnected stacks 50. The vertical second portion 23 of the right side leads 21 of the left stack 50 abut and are electrically connected by solder to the vertical second portion 23 of the left side leads 21 of the right stack 50. Accordingly, the integrated circuits 28 in stack 51 may be electrically interconnected.

Packages 10, 40, 50, 52, and 54 of FIGS. 1, 3, 6, 7, and 8, respectively, as well as packages 80, 85, 90, and 99 of FIGS. 13–16, respectively, also can be stacked and/or horizontally interconnected as shown in FIGS. 8A–8D. Artisans should appreciate that a great number of variations are possible in the manner that the package embodiments shown herein may be stacked. Accordingly, the user of the packages has considerable freedom in choosing how to arrange and interconnect the packages, and in choosing the number of packages to be stacked and/or placed side by side.

Figure 9:
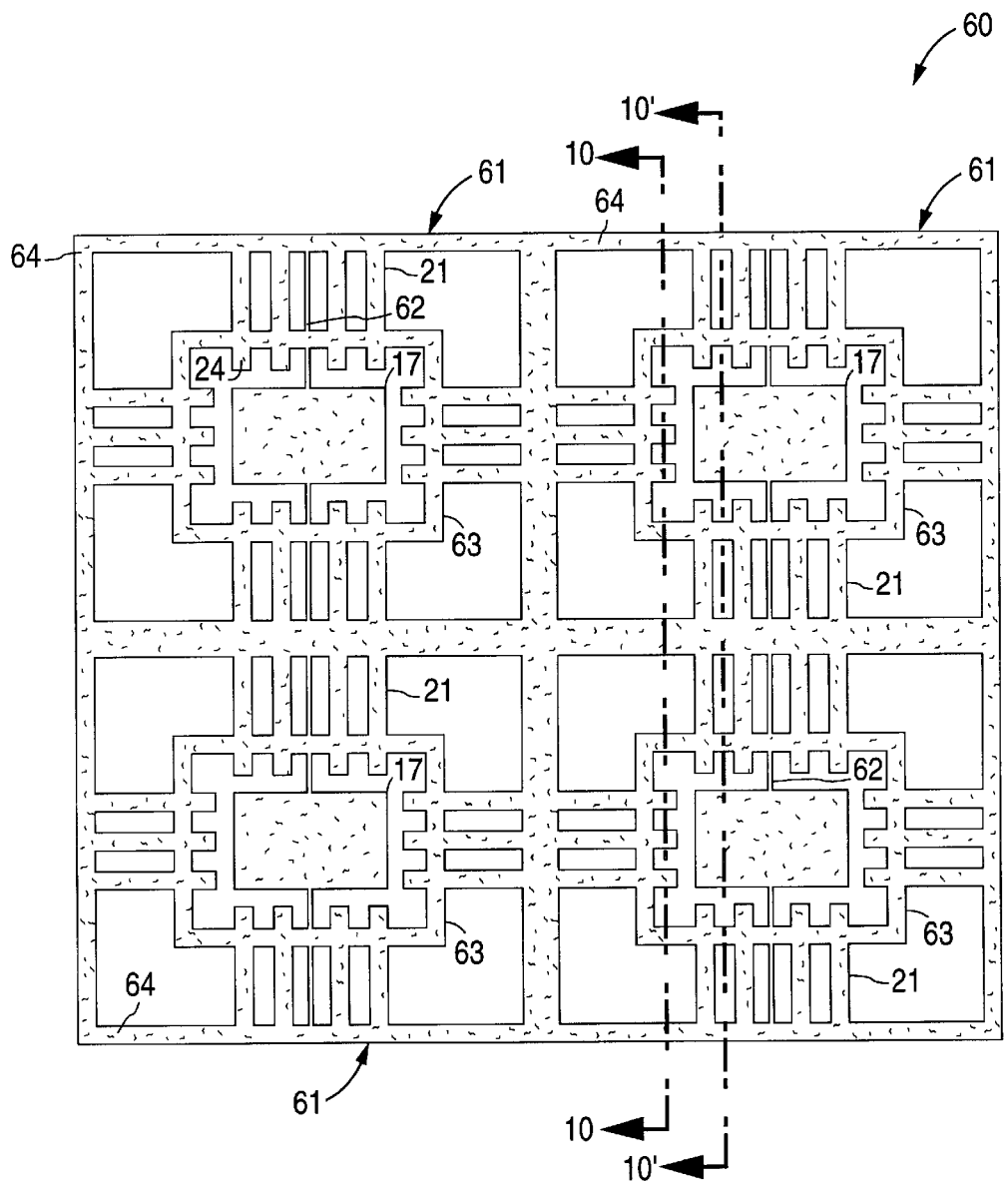
FIG. 9 shows a patterned metal sheet 60 including an array of four leadframes 61.

FIG. 9 shows a patterned planar metal sheet 60 that includes an array of four planar leadframes 61. Sheet 60 may be used to make four packages 10, 40, 44, 50, 52, 54, or 80 in parallel. Sheet 60 may be made of conventional leadframe metals, such as copper, copper alloy, or Alloy 42, among other possibilities. The number of leadframes 61 on a metal sheet is variable, and the specific pattern of the leadframe is a variable. As an example, leadframe 61 may be 0.10 mm to 0.25 mm thick. Portions of leadframes 61 may be plated with conventional plating metals, such as gold, nickel gold, palladium or silver, to enhance solderability.

Each leadframe 61 of sheet 60 includes a die pad 17 and leads 21. As stated above, the number of leads 21 will vary with the application. For purposes of example, each leadframe 61 ultimately would form a package with 14 leads (or 13 leads if one is removed for keys 15 and keyholes 16 as in FIG. 4).

Each leadframe 61 of sheet 60 is within a rectangular frame formed by four tie bars 64. Leads 21 extend from a first end that is integrally connected with a tie bar 64 to a second end that is adjacent to, but separated from, die pad 17. A dam bar 63 located between the tie bars 64 and the die pad 17 is integrally connected to the leads 21. In an alternative embodiment (not shown), a lead 21 is integrally connected to die pad 17, as in package 42 of FIG. 4.

The leadframes 61 of metal sheet 60 may be formed by chemical etching using a photoresist mask, or by progressive stamping. For packages 10, 40, 44, 50, 52, or 54, leadframe 61 may be formed so that side surfaces 20 of die pad 17 and side surfaces 27 of leads 21 have a reentrant profile that that engages the encapsulant that forms package body 11. The reentrant profile function to lock die pad 17 and leads 21 to package body 11. In addition, side surfaces 20 and 27 may have asperities thereon, which also function to lock die pad 17 and leads 21 to the encapsulant. Anchors, such as a through-holes or ears, also may be provided for leads 21.

FIGS. 10A–10D show exemplary reentrant profiles for side surfaces 20 of die pad 17 and side surfaces 27 of leads 21. The view of side surface 20 of die pad 17 is taken along line 10'—10' of FIG. 9, and the view of side surface 27 of third portion 24 of leads 21 is taken along line 10—10 of FIG. 9.

In FIG. 10A, side surfaces 20 and 27 include two reentrant portions on opposite sides of a protruding apex 65, and numerous small asperities that are much smaller in depth than the reentrant portion. This profile may be formed by chemically etching an unpatterned metal sheet from both sides and underetching, that is, etching for less time than would be required to form orthogonal side surfaces 20 and 27. The encapsulant of package body 11 fills the reentrant portions, covers apex 65 and fills the asperities. In FIG. 10B, side surfaces 20 and 27 include a central depression 66 and numerous small asperities. This profile may be formed by chemically etching an unpatterned metal sheet from one side and overetching, that is, etching for more time than would be required to form orthogonal side surfaces 20 and 27. The encapsulant fills depression 66 and the asperities. In FIG. 10C, side surfaces 20 and 27 include a cornice-like top portion 67 that begins at first surfaces 18 and 25 of die pad 17 and leads 21, respectively, and extends outward beyond a reentrant lower orthogonal portion 68 that is between protruding top portion 67 and second surfaces 19 and 26, respectively. Asperities cover top portion 67. Encapsulant 11 fills in under top portion 67 and fills the asperities. This profile may be formed by patterning metal sheet 60 using chemical etching or progressive stamping so that orthogonal side surfaces 20 and 27 are formed, and then coining first surfaces 18 and 25 to form top portion 67. Finally, in FIG. 10D, side surfaces 20 and 27 have an inverted L-shape that may be formed by stamping partially through the metal sheet. Encapsulant 11 fills in beneath the protruding top portion 69 and contacts reentrant orthogonal portion 70.

FIG. 11 is a flow chart of method 75 of making packages 10, 40, 44, 50, 52, or 54. Step 1 provides a leadframe 61, or a sheet 60 of leadframes 61, depending on whether the packages are made one at a time or in parallel. For the purpose of example, assume that Step 1 provides sheet 60 of FIG. 9.

Referring to FIGS. 1 and 3–8, Step 2 attaches an integrated circuit 28 (or some other electronic device) to first surface 18 of each die pad 17 of the respective leadframe 61 of sheet 60 using, for example, conventional adhesives and pick and place equipment.

Step 3 connects a metal bond wire (e.g., a gold or gold alloy bond wire) between each bond pad 29 of each integrated circuit 28 and a first surface 25 of a third portion 24 of each lead 21 of leadframes 61. Conventional bond wiring methods, equipment, and materials may be used.

Step 4 applies an encapsulant to each integrated circuit 28 and to the portion of each leadframe 61 that is within dam bar 63. An individual package body 11 formed of encapsulant 11 may be made for each leadframe 61 using conventional transfer or injection molding techniques, molds, and materials. If packages 52 or 54 of FIG. 6 and 7, respectively, are being formed, grooves 53 are formed in first surface 12 of the package body. The encapsulant is then cured.

Figure 12A:
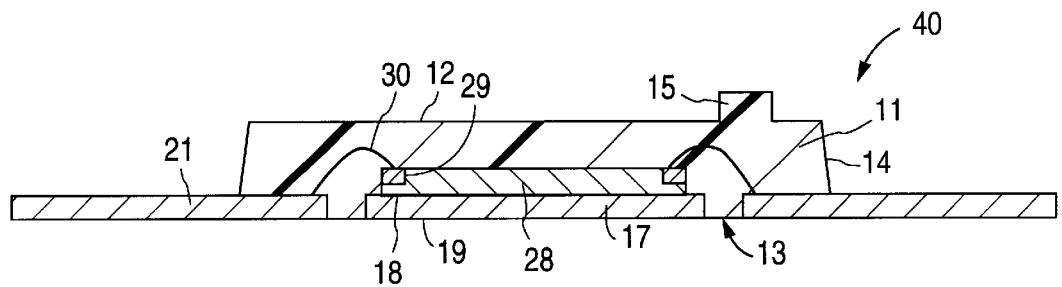
FIGS. 12A–12C are cross-sectional side views of stages in the making of a package 40.

During Step 4, the encapsulant is applied so as to cover integrated circuit 28, first surface 18 and side surfaces 20 of die pad 17, and first surface 25 and side surfaces 27 of third portion 24 of leads 21 (see FIG. 12A). In particular, encapsulant covers the reentrant portions and asperities of side surfaces 20 and 27 so that die pad 17 and leads 21 are locked to package body 11. If package 10 of FIG. 1 or package 44 of FIG. 5 are being made, then die pad 11 is up set in the mold so that encapsulant 11 will cover second surface 19 of die pad 17.

Step 5 is a deflash and debar step that removes excess encapsulant and dam bar 63. Conventional deflash and debar methods may be used. Step 6 separates the individual packages from patterned sheet 60 using, for example, a conventional punch. As an example, FIG. 12A shows an incomplete version of package 40 of FIG. 3 after Step 6. Leads 21 may be dipped in solder or plated with 80-20 solder or some other solder for subsequent electrical interconnection to a printed circuit board or to the abutting leads of other packages 40.

Figure 12B:
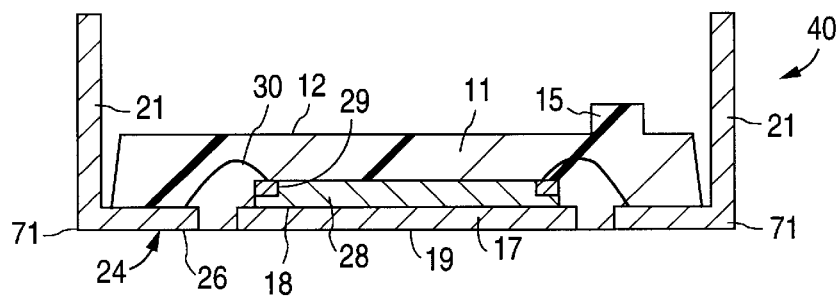
Figure 12C:
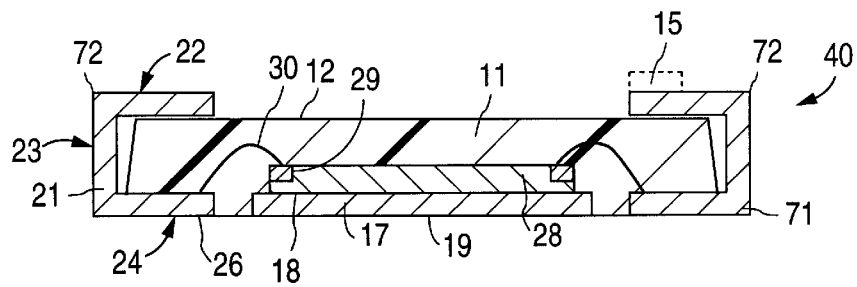

Step 7 trims and forms leads 21 so that leads 21 are provided with the bends shown in FIGS. 1 and 3–8. In one embodiment illustrated in FIGS. 12B and 12C, the trim and form operation includes a first lead bending step that forms a lower first bend 71 at second surface 13 of package 40, and then has a second lead bending step that forms an upper second bend 72 at first surface 12 of package 40.

Figure 12D:
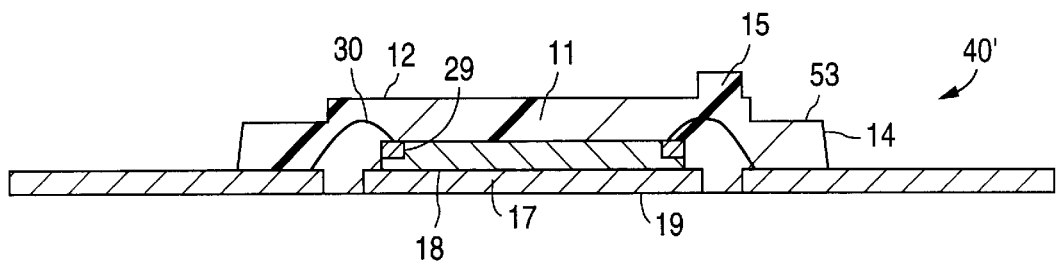
FIGS. 12D–12F are cross-sectional side views of stages in the making of a thin package 40'.
Figure 12E:
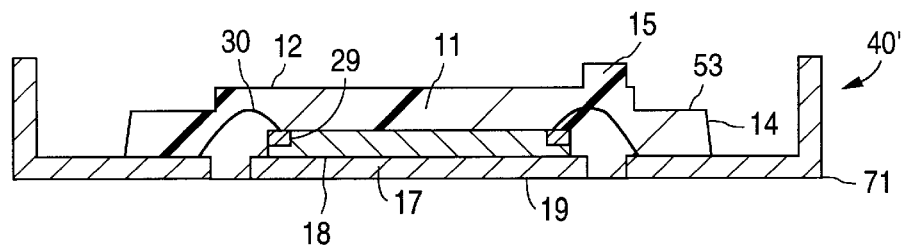
Figure 12F:
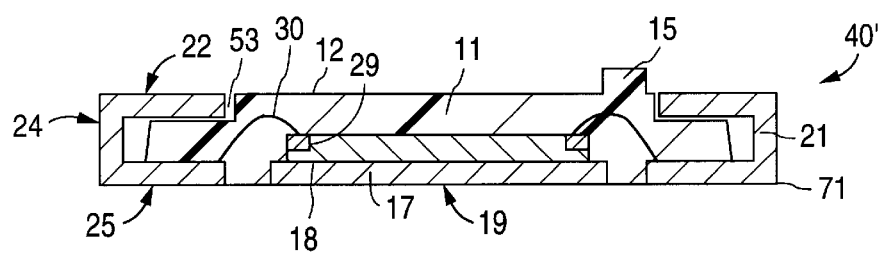

FIGS. 12D–12F illustrate similar stages in the making of a thin package 40', which is similar to package 40 of FIGS. 3 and 12A–12C, except for the presence of grooves 53 on first surface 12 of package body 11. Similar grooves were discussed above with respect to package 52 of FIG. 6. Leads 21 of package 40' are bent during a trim and form step so that each lead 21 fits into a groove 53. Because package 40' is thinner than package 40, leads 21 of package 40' do not have to be as long.

Figure 13:
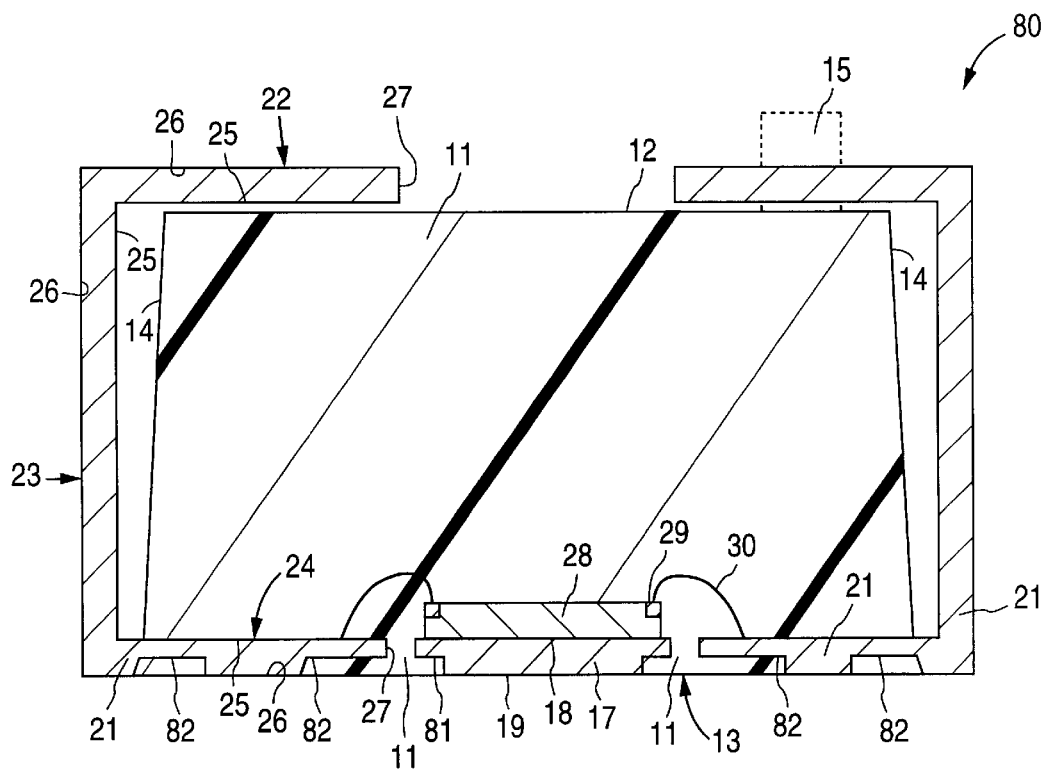
FIG. 13 is a cross-sectional side view of a package 80 wherein encapsulant 11 has filled in underneath portions of die pad 17 and leads 21.

FIG. 13 shows another package embodiment within the present invention. Package 80 of FIG. 13 is similar to package 40 of FIG. 3, except that package 80 has a different approach to locking die pad 17 and leads 21 to package body 11. In particular, instead of having reentrant profiles on side surfaces 20 and 27, as shown in FIGS. 10A–10D, approximately half of the thickness of a peripheral portion of die pad 17 and selected parts of third portion 24 of each lead 21 are removed so that encapsulant will fill in under those parts during the encapsulation step. Referring to FIG. 13, encapsulant fills in beneath the reentrant or indented peripheral portion 81 of die pad 17 and beneath reentrant or indented portions 82 of third portion 24 of lead 21. The remaining parts of die pad 17 and leads 21, which have their original thickness, are exposed at second surface 13 of package 80 and thus are available for electrical connection.

Package 80 is formed from a leadframe similar to leadframe 61 of FIG. 9. After the leadframe is formed by chemical etching or progressive stamping, a photoresist pattern is placed on the leadframe. The mask has holes through which the portions of the leadframe that are to be thinned are exposed. Next, the exposed portions are etched away until a predetermined thickness remains, e.g., approximately half of the thickness of the leadframe, so that second surface 19 of die pad 17 and second surface 26 of third portion 24 of leads 21 have a reentrant profile (e.g., have indented surfaces 81 and 82). At that point, etching is stopped. In an alternative embodiment, die pad 17 and leads 21 are given both reentrant side surface profiles (as in FIGS. 10A–10D) and reentrant lower surface profiles (as in FIG. 13).

Figures 14, 15, 16:
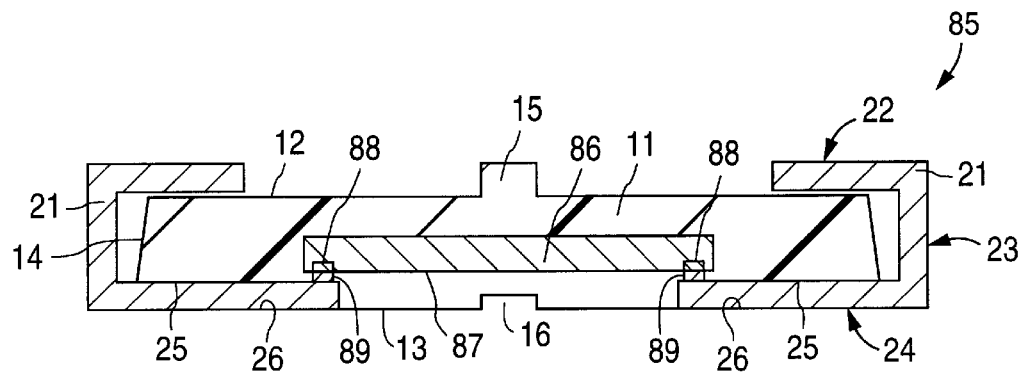
FIG. 14 is a cross-sectional side view of a stackable package 85 including a flip chip integrated circuit 86.
FIG. 15 is a cross-sectional side view of a lead-on-chip stackable package 90.
FIG. 16 is a cross-sectional side view of an alternative lead on chip stackable package 99.

FIG. 14 illustrates an alternative stackable package 85 in accordance with another embodiment of the present invention. Package 85 is similar to package 10 of FIG. 1, except that package 85 lacks the die pad 17 of package 10. In addition, package 85 includes a rectangular flip chip style integrated circuit 86 instead of the wire bonded integrated circuit 28 of package 10.

In package 85 of FIG. 14, flip chip integrated circuit 86 includes a first surface 87 having a row of metal bond pads 88 along opposing edges of first surface 87. Bond pads 88 may be along two opposing edges of flip chip integrated circuit 86, so that package 85 is a dual package, or may be along all four edges of first surface 87, so that package 85 is a quad package.

In package 85, third portions 24 of leads 21 are longer than third portions 24 of leads 21 of package 10 of FIG. 1 so that flip chip integrated circuit 86 may be mounted on third portions 24. Each bond pad 88 of flip chip integrated circuit 86 of FIG. 14 is electrically connected by a solder bump 89 in a flip chip style mounting to a first surface 25 of a third portion 24 of a lead 21. To lock leads 21 to the encapsulant, leads 21 may have reentrant side surfaces 27, as shown in FIGS. 10A–10D, or third portions 24 of leads 21 may have indented surfaces 82, as in FIG. 13, or both.

Figure 17:
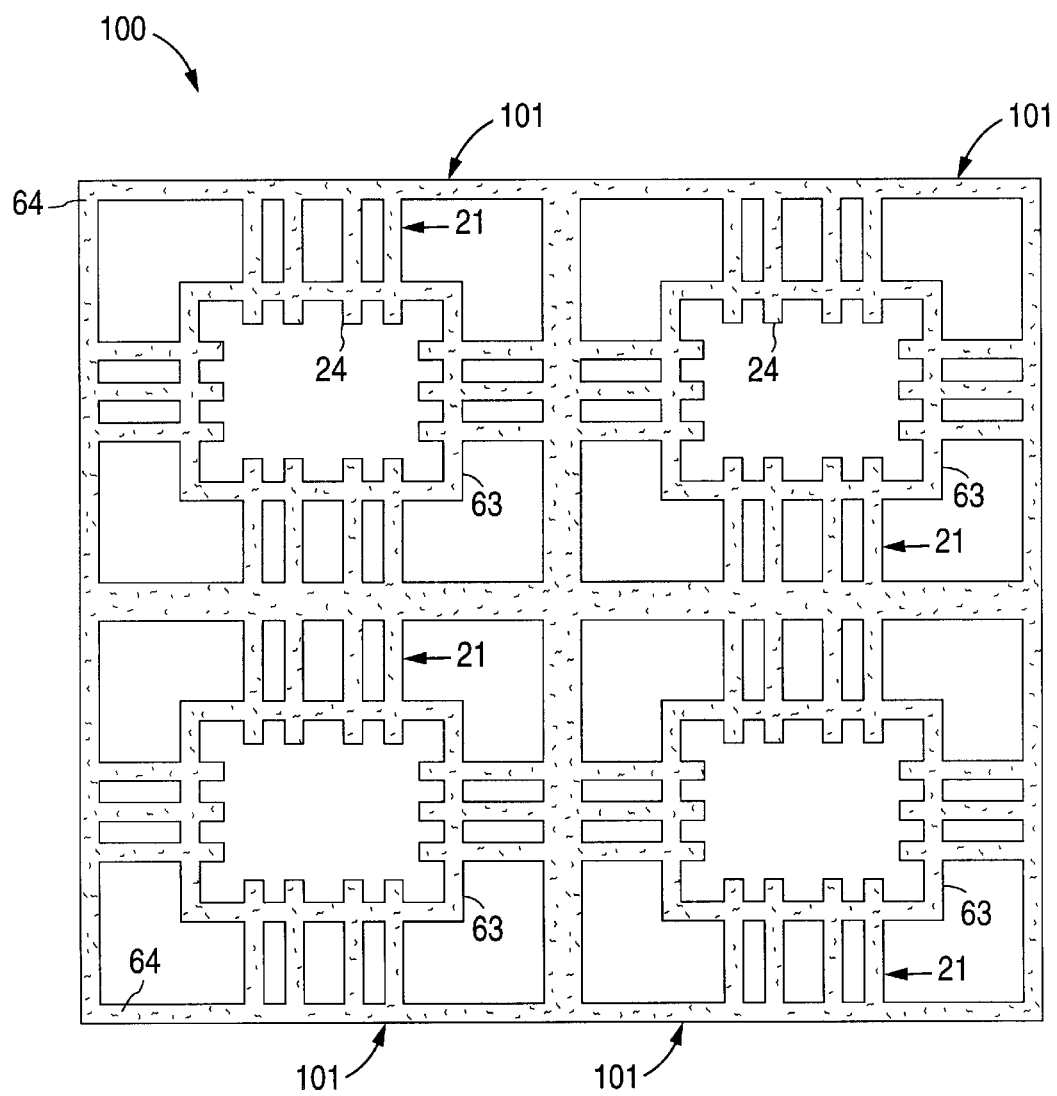
FIG. 17 is plan view of a patterned metal sheet 100 including an array of four leadframes 101 for making a package 85 of FIG. 14.

FIG. 17 is a plan view of a patterned planar metal sheet 100 that includes an array of four planar leadframes 101 that may be used to make package 85 of FIG. 15. Sheet 100 is similar to sheet 60 of FIG. 9, except that leadframes 100 lack die pads 17 of leadframes 60, and third portions 24 (inside dam bars 63) of leads 21 of leadframes 100 are longer than third portions 24 of leads 21 of leadframes 60.

FIG. 15 illustrates an alternative stackable package 90 in accordance with another embodiment of the present invention. Package 90 is similar to package 85 of FIG. 14, except that package 90 has a differently mounted integrated circuit and corresponding differences in the configuration of leads 21. As in package 85, there is no die pad, and the integrated circuit is mounted on an encapsulated portion of leads 21.

In package 90 of FIG. 15, integrated circuit 91 includes a first surface 92 having two centrally located rows of bond pads 93. Accordingly, package 90 is a dual package having leads 21 that extend from two opposing sides of package 90. Bond pads 93 are electrically connected by bond wires 30 to leads 21.

As in packages 10 and 85, leads 21 of package 90 include a first portion 22 that extends horizontally over first surface 12 of package body 11, and a second portion 23 that extends vertically adjacent to side surface 14 of package body 11. The encapsulated portion of leads 21 of package 90, however, is longer than in packages 10 and 85. The encapsulated portion of each lead 21 includes: (1) a fully encapsulated first part 94 that extends horizontally over and is attached to first surface 92 of integrated circuit 91; (2) a fully encapsulated middle second part 97 that extends at an oblique angle from first part 94 toward second surface 13 of package body 11; and (3) a partially encapsulated third part 98 that extends horizontally from oblique second part 97 to vertically extending second portion 23 of lead 21. Third part 98 of leads 21 includes an exposed second surface 26 that may be used to electrically connect package 90 to a printed circuit board or another stackable package. Second surface 26 of first part 94 of leads 21 is attached to first surface 92 of integrated circuit 91 by an adhesive layer 95. Adhesive layer 95 may be an adhesive film or an epoxy layer. Since encapsulant is under first part 94 and second part 97 of leads 21 of package 90, leads 21 are locked to package body 11. If desired, however, leads 21 may be provided with reentrant side surfaces 27, as shown in FIGS. 10A–10D.

FIG. 16 illustrates an alternative stackable package 99 within the present invention. Package 99 is similar to package 90, except that, in package 99, integrated circuit 91 is mounted on first surface 25 of first part 94 of leads 21 instead of on second surface 26 of first part 94, as in package 90 of FIG. 15.

Package 90 and of FIG. 15 and package 99 of FIG. 16 may be made with a leadframe similar to leadframe 100 of FIG. 17, except with slightly longer leads. Prior to die attach, the leads are bent to form first part 94, second part 97, and third part 98, as shown in FIGS. 15 and 16.

The packages described above have the unique capability of being easily stacked and interconnected. Stacking can be used to increase the density of the packages without increasing the mounting area on a printed circuit board consumed by the packages. Moreover, the user can easily add more packages to a given application. This may be useful, for example, when the packages contain memory devices such as DRAMs, SRAMs, or flash memory, and the user wants the capability to easily increase the total memory. Of course, the density may be increased further by including a plurality of integrated circuits in each package.

The embodiments described herein are merely examples of the present invention. Artisans will appreciate that variations are possible within the scope of the claims.

I claim:

1. A package for an electronic device comprising:
    a package body formed of an encapsulant material, said package body having a first surface, an opposite second surface, and side surfaces extending vertically between said first and second surfaces, wherein said package body includes an integral first member protruding from the first or second surfaces of the package body, and the other of the first or second surfaces of the package body includes a hole shaped to receive another member shaped similar to said first member;
    a plurality of leads, each said lead having an embedded first portion at the second surface of the package body, a second portion extending vertically adjacent to a side surface of the package body, and a third portion extending over the first surface of the package body, wherein a first surface of said first portion of each lead is exposed at the second surface of the package body; and
    an electronic device within said package body and electrically connected to one or more of said leads.

2. The package of claim 1, further comprising a metal die pad, wherein said electronic device is on a first surface of said die pad.

3. The package of claim 1, wherein the third portion of the lead extends horizontally over said first surface of the package body.

4. The package of claim 1, wherein the third portion of the leads is at an oblique angle relative to the first surface of the package body.

5. The package of claim 1, wherein at least the first portion of each lead includes vertically extending side surfaces between the first surface and an opposite second surface of the lead, said side surfaces having a reentrant portion, wherein said reentrant portion is covered by encapsulant material.

6. The package of claim 1, wherein at least the first portion of each lead includes vertically extending side surfaces between the first surface and an opposite second surface of the lead, wherein said side surfaces are covered by said encapsulant material, and said side surfaces include a means for locking the lead to the encapsulant material.

7. The package of claim 1, wherein the first portion of each lead includes a recessed surface immediately adjacent to the exposed first surface of the first portion of the lead, said recessed surface being covered by said encapsulant material.

8. The package of claim 1, wherein the third portion of each of said leads is in a groove in the first surface of the package body.

9. The package of claim 1, wherein a passive component is electrically connected between the second portion of a plurality of leads.

10. The package of claim 1, wherein a passive component is electrically connected between the first portion of a plurality of leads.

11. The package of claim 1, wherein the electronic device is mounted on the first portion of a plurality of leads.

12. The package of claim 2, wherein said die pad includes a second surface that is opposite the first surface of the die pad, wherein at least part of said second surface is exposed at the second surface of the package body.

13. The package of claim 12, wherein at least one lead is electrically connected to the die pad.

14. The package of claim 12, wherein the die pad and at least the first portion of each lead includes vertically extending side surfaces between the first surface and an opposite second surface thereof, wherein the side surfaces of the die pad and of the first portion of the leads have a reentrant portion, and said encapsulant material fills said reentrant portion.

15. The package of claim 12, wherein the die pad and at least the first portion of each lead include vertically extending side surfaces between the first surface and the second surface thereof, wherein said side surfaces of the die pad and of the first portion of the leads are covered by said encapsulant material, and said side surfaces include a means for locking the respective die pad or lead to the encapsulant material.

16. The package of claim 12, wherein the first portion of each lead includes a recessed surface immediately adjacent to the exposed first surface of the first portion of the lead, said recessed surface being covered by said encapsulant material; and wherein the second surface of the die pad includes a central portion exposed at the second surface of the package body, and a recessed peripheral portion around said central portion, said peripheral portion covered by said encapsulant material.

17. The package of claim 5, wherein the side surfaces of the first portion of the leads include asperities covered by said encapsulant material, said asperities being much smaller in depth than said reentrant portions.

18. The package of claim 11, wherein the electronic device is a flip chip style integrated circuit having bond pads that are in an electrical connection with the first portion of the leads.

19. The package of claim 11, wherein the first portion of the leads includes at least a fully encapsulated first part upon which the electronic device is mounted and a second part at the second surface of the package, said second part including the exposed first surface.

20. A package for an electronic device comprising:
a package body formed of an encapsulant material, said package body having a first surface and an opposite second surface, wherein said package body includes an integral first member protruding from the first or second surfaces of the package body, and the other of the first or second surfaces includes a hole shaped to receive another member shaped similar to said first member;
a plurality of leads each partially embedded in said package body, and
an electronic device within said package body and electrically connected to one or more of said leads.

21. The package of claim 20, further comprising a metal die pad having a first surface, wherein said electronic device is on a first surface of said die pad.

22. The package of claim 20, wherein at least the embedded portion of each lead includes a first surface, an opposite second surface exposed at one of the first or second surfaces of the package body, and side surfaces between the first and second surface, the side surfaces having a reentrant portion that is covered by encapsulant material.

23. The package of claimed 20, wherein the embedded portion of each lead includes a lower surface that is exposed at one of the first or second surfaces of the package body and a recessed surface immediately adjacent to the exposed surface, said recessed surface being covered by said encapsulant material.

24. The package of claim 21, wherein said die pad includes a second surface that is opposite the first surface of the die pad, wherein at least part of said second surface is exposed at the second surface of the package body.

25. A module of electrically interconnected electronic device packages comprising:
at least first and second electronic device packages stacked one on top of the other, each said package comprising a package body formed of an encapsulant material, said package body having a first surface, an opposite second surface, and side surfaces extending vertically between said first and second surfaces, an electronic device within said package body, and a plurality of leads, each said lead having an embedded first portion at the second surface of the package body, a second portion extending vertically adjacent to a side surface of the package body, and a third portion extending over the first surface of the package body, and wherein a first surface of said first portion of each lead is exposed at the second surface of the package body,
wherein a portion of at least some of said plurality of leads of said first package are juxtaposed with and electrically connected to a portion of at least some of the leads of said second package, and
wherein said package body of at least one of the first and second packages includes an integral member protruding from the first or second surface of the package body, and the package body of at least the other of the first and second packages includes a hole in the first or second surface of the package body, and the member of the at least one package is within the hole of the other package.

26. The module of claim 25, wherein the exposed first surface of the first portion of the leads of the second package are juxtaposed with and electrically connected to the third portion of the leads of the first package.

27. The module of claim 25, wherein a passive component is electrically connected between portions of leads of the first or second packages that are external to the package body.

28. The module of claim 25, further comprising a third electronic device package having a package body formed of a molded encapsulant material, said package body having a first surface, an opposite second surface, and side surfaces extending vertically between said first and second surfaces, an electronic device within said package body, and a plurality of leads, each said lead having an embedded first portion at the second surface of the package body, a second portion extending vertically adjacent to a side surface of the package body, and a third portion extending over the first surface of the package body, and wherein a first surface of said first portion of each lead is exposed at the second surface of the package body; and wherein at least some of said plurality of leads of said third package are juxtaposed with and electrically connected to at least some of the leads of the first or second packages or both the first and second packages.

29. A module of electrically interconnected electronic device packages comprising:

at least first and second electronic device packages stacked one on top of the other, each comprising a package body formed of an encapsulant material, said package body having a first surface and an opposite second surface, wherein an electronic device is within said package body, and a plurality of leads that are partially embedded in the package body, wherein said package body of at least one of the first and second packages includes an integral member protruding from the first or second surface of the package body, and the first or second surfaces of the package body of the other of the first and second packages includes a hole, and the member of the at least one package is within the hole of the other package, and wherein at least a portion of some of said plurality of leads of said first package are juxtaposed with and electrically connected to a portion of at least some of the leads of said second package.

30. The module of claim 29, wherein at least one of the packages comprises a metal die pad having a first surface, wherein said electronic device is on a first surface of said die pad.

31. The module of claim 30, wherein said die pad includes a second surface that is opposite the first surface of the die pad, and at least part of said second surface is exposed at the second surface of the package body.

32. The module of claim 29, wherein at least the embedded portion of each lead includes a first surface, an opposite second surface exposed at one of the first or second surfaces of the package body, and side surfaces between the first and second surface, the side surfaces having a reentrant portion that is covered by encapsulant material.

33. The module of claim 29, wherein the embedded portion of each lead includes a surface that is exposed at one of the first or second surfaces of the package body and a recessed surface immediately adjacent to the exposed surface, said recessed surface being covered by said encapsulant material.

* * * * *

UNITED STATES PATENT AND TRADEMARK OFFICE
CERTIFICATE OF CORRECTION

PATENT NO.    : 6,320,251 B1
DATED         : November 20, 2002
INVENTOR(S)   : Thomas P. Glenn It is certified that error appears in the above-identified patent and that said Letters Patent is hereby corrected as shown below:

Column 2,
Line 39, before "BRIEF DESCRIPTION OF DRAWINGS" insert -- These and other embodiments of the present invention, along with many of its advantages and features, are presented in greater detail below in the accompanying figures. --

Column 5,
Line 4, delete "17" insert -- 18 --;
Line 14, delete "17" insert -- 18 --;
Line 22, delete "17" insert -- 18 --;
Line 23, delete "pads" insert -- pad --;
Line 23, delete "17" insert -- 18 -- (both occurrences);
Line 54, delete "55" insert -- 54 --;

Column 6,
Line 22, delete "50" insert -- 42 --;
Line 22, insert -- 4, -- after "3,";
Line 22, delete "7";
Line 23, delete "8" insert -- 7 --; and Column 8,
Line 2, delete "11" insert -- 17 --

Signed and Sealed this

Twenty-fourth Day of December, 2002

JAMES E. ROGAN
*Director of the United States Patent and Trademark Office*